(12) United States Patent
Hawrylchak et al.

(10) Patent No.: US 11,004,704 B2
(45) Date of Patent: May 11, 2021

(54) FINNED ROTOR COVER

(71) Applicant: Applied Materials, Inc., Santa Clara, CA (US)

(72) Inventors: Lara Hawrylchak, Gilroy, CA (US); Chaitanya A. Prasad, Bangalore (IN); Emre Cuvalci, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 305 days.

(21) Appl. No.: 15/921,819

(22) Filed: Mar. 15, 2018

(65) Prior Publication Data
US 2018/0269083 A1 Sep. 20, 2018

Related U.S. Application Data

(60) Provisional application No. 62/472,840, filed on Mar. 17, 2017.

(51) Int. Cl.
*H01L 21/67* (2006.01)
*H01L 21/324* (2006.01)
*H01L 21/687* (2006.01)

(52) U.S. Cl.
CPC ...... *H01L 21/67098* (2013.01); *H01L 21/324* (2013.01); *H01L 21/67115* (2013.01); *H01L 21/67248* (2013.01); *H01L 21/68735* (2013.01); *H01L 21/68792* (2013.01)

(58) Field of Classification Search
CPC ............. H01L 21/67098; H01L 21/324; H01L 21/67115; H01L 21/67248; H01L 21/68735; H01L 21/68792; C23C 16/4404; C23C 16/4411; C23C 16/45504; C23C 16/4558; C23C 16/45582; C23C 16/45591
USPC ..... 219/390, 408, 411, 444.1, 385; 392/416, 392/418; 118/715, 724, 825, 728, 729, 118/730
See application file for complete search history.

(56) References Cited

U.S. PATENT DOCUMENTS

| 5,356,476 | A | 10/1994 | Foster et al. |
| 5,551,982 | A * | 9/1996 | Anderson ............. C23C 16/455 118/715 |
| 6,133,152 | A | 10/2000 | Bierman et al. |
| 6,860,634 | B2 | 3/2005 | Shigeoka |

(Continued)

FOREIGN PATENT DOCUMENTS

JP WO2000070662 A1 * 11/2000

*Primary Examiner* — Phuong T Nguyen
*Assistant Examiner* — Yeong Juen Thong
(74) *Attorney, Agent, or Firm* — Patterson + Sheridan, LLP

(57) ABSTRACT

Embodiments described herein generally relate to a processing apparatus having a cover piece that participates in preheating a process gas. In one implementation, the cover piece includes an annulus. The annulus has an inner wall with a first height, an outer wall with a second height, and a top surface. The second height is greater than the first height. The cover piece also includes an inner lip disposed adjacent the inner wall, and a plurality of fins disposed on the top surface of the annulus. The cover piece and the plurality of fins are an opaque quartz material. The cover piece provides for more efficient heating of process gases, is composed of a material capable of withstanding process conditions while providing for more efficient and uniform processing, and has a low CTE reducing particle contamination due to excessive expansion during processing.

16 Claims, 6 Drawing Sheets

(56) References Cited

U.S. PATENT DOCUMENTS

| | | | |
|---|---|---|---|
| 7,842,229 B2 | 11/2010 | Tanaka et al. | |
| 8,217,317 B2 | 7/2012 | Tseng | |
| 8,980,005 B2 * | 3/2015 | Carlson | C23C 16/45574 |
| | | | 118/715 |
| 9,385,004 B2 | 7/2016 | Behdjat et al. | |
| 2005/0118737 A1 * | 6/2005 | Takagi | H01J 37/32935 |
| | | | 438/14 |
| 2005/0271984 A1 * | 12/2005 | Brueckner | C23C 14/564 |
| | | | 430/323 |
| 2006/0066193 A1 | 3/2006 | Ranish et al. | |
| 2006/0223315 A1 | 10/2006 | Yokota et al. | |
| 2010/0054720 A1 | 3/2010 | Hunter et al. | |
| 2011/0123178 A1 | 5/2011 | Aderhold et al. | |
| 2015/0020734 A1 | 1/2015 | Ye et al. | |
| 2017/0244070 A1 | 8/2017 | Bangert et al. | |
| 2017/0294324 A1 * | 10/2017 | Breingan | B08B 3/14 |
| 2019/0032194 A2 | 1/2019 | Dieguez-Campo et al. | |

* cited by examiner

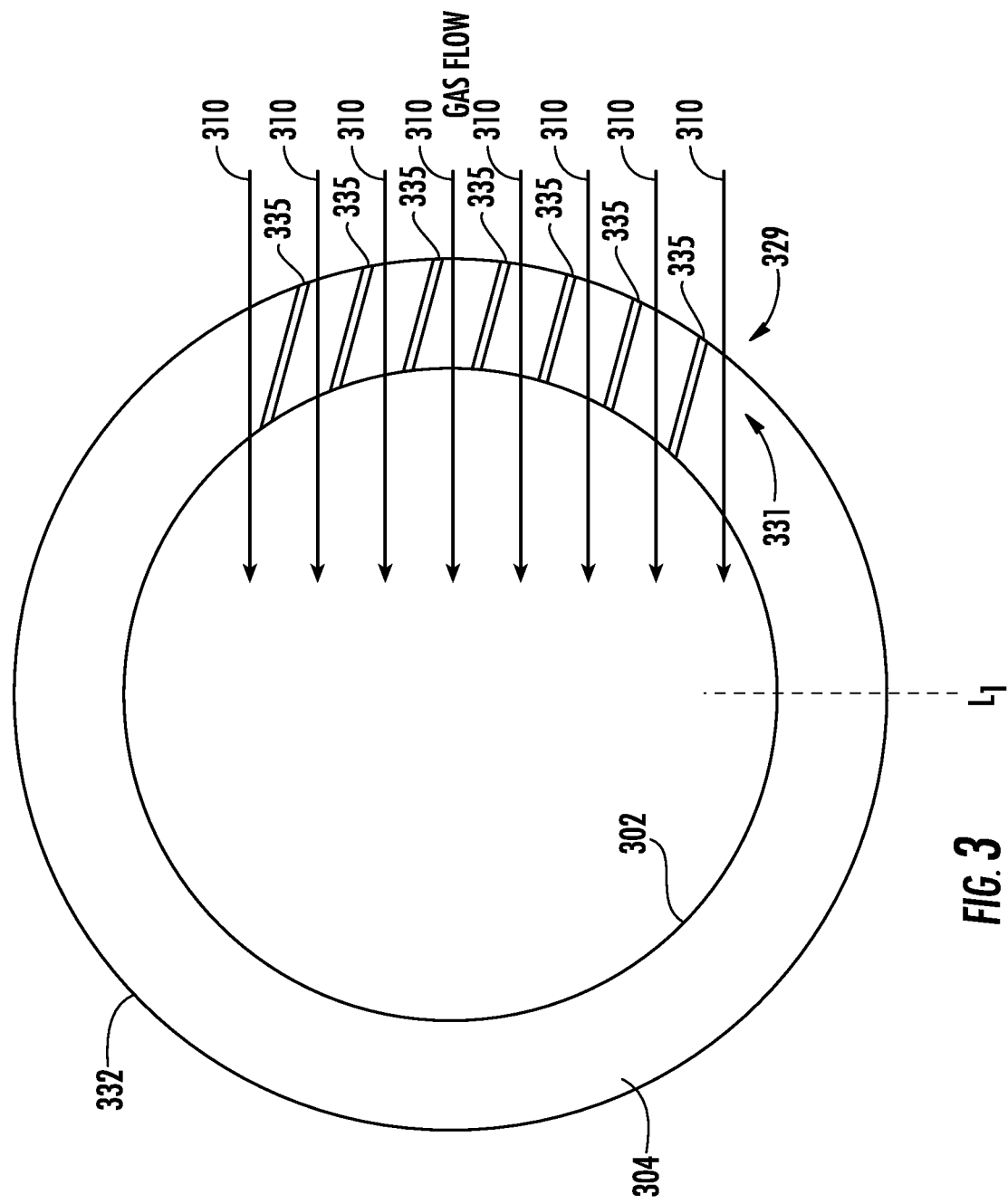

FINNED ROTOR COVER

CROSS-REFERENCE TO RELATED APPLICATIONS

This application claims benefit of U.S. Provisional Patent Application Ser. No. 62/472,840 filed Mar. 17, 2017, which is incorporated herein by reference.

BACKGROUND

Field

Implementations described herein generally relate to thermal treatment of substrates.

Description of the Related Art

Thermal treatment of substrates is a staple of the semiconductor manufacturing industry. Substrates are subjected to thermal treatments in a variety of processes and apparatuses. In some processes, substrates are subjected to annealing thermal energy while others may be subjected to oxidizing or degassing conditions. One substrate after another is positioned in an apparatus, heated for processing, and then cooled. The apparatus for thermally processing the substrate may undergo hundreds or thousands of extreme heating and cooling cycles every day.

In addition to thermal treatment of substrates, various aspects of operating the apparatus may require materials with certain electrical, optical, or thermal properties. Adding to the complexity, continuous reduction in size of semiconductor devices is dependent upon more precise control of, for instance, the flow and temperature of process gases delivered to a semiconductor process chamber. In a cross-flow process chamber, a process gas may be delivered to the chamber and directed across the surface of a substrate to be processed. As the process temperature reduces, process gas activation becomes a challenge in thermal chambers. Insufficient process gas activation causes low precursor utilization and poor thickness profile. Design of an apparatus can present formidable engineering challenges to those wishing to prolong the useful life of such apparatus under the extreme conditions to which they are subjected.

Thus, there is a need for apparatus capable of performing reliably under the extreme thermal cycling of modern semiconductor processes while having improved process gas preheating.

SUMMARY

Implementations described herein generally relate to a thermal processing apparatus. In one implementation, a rotor cover for a thermal treatment chamber is disclosed. The rotor cover includes an annulus having an inner wall, an outer wall, and a top surface. The inner wall has a first height and the outer wall has a second height. The second height is greater than the first height. The annulus is an opaque quartz material. The rotor cover also includes an inner lip that is adjacent the inner wall and a plurality of protrusions that are disposed on the top surface of the annulus.

In another implementation, an apparatus for processing a substrate is disclosed. The apparatus includes a chamber body having a side wall and a bottom wall defining an interior processing region. The chamber also includes a substrate support disposed in the interior processing region of the chamber body, a ring support, and a rotor cover disposed on the ring support. The rotor cover includes an annular body. The annular body is an opaque quartz material. The rotor cover also includes a plurality of protrusions disposed on the annular body. The plurality of protrusions are a silicon black quartz.

In yet another implementation, a rotor cover for a thermal treatment chamber is disclosed. The rotor cover includes an annulus having an inner wall, an outer wall, and a top surface. The annulus is an opaque quartz material. The rotor cover also includes an inner lip that is adjacent the inner wall and a plurality of fins that are disposed on the top surface of the annulus. The plurality of fins are silicon black quartz. The plurality of fins include a plurality of projections.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 shows a top view of the rotor cover according to according to another implementation described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Implementations described herein generally relate to a processing apparatus having a rotor cover for preheating the process gas. The rotor cover is a cover piece disposed on a ring support. The rotor cover may have a segment adjacent to a process gas inlet. The segment includes a top surface, and the top surface includes features to increase the surface area of the top surface. The rotor cover is an opaque quartz material. The rotor cover advantageously provides for more efficient heating of process gases, is composed of a material capable of withstanding process conditions while providing for more efficient and uniform processing, and has a low CTE reducing thermal expansion cycles and particle contamination resulting from such cycles.

Figure 1:
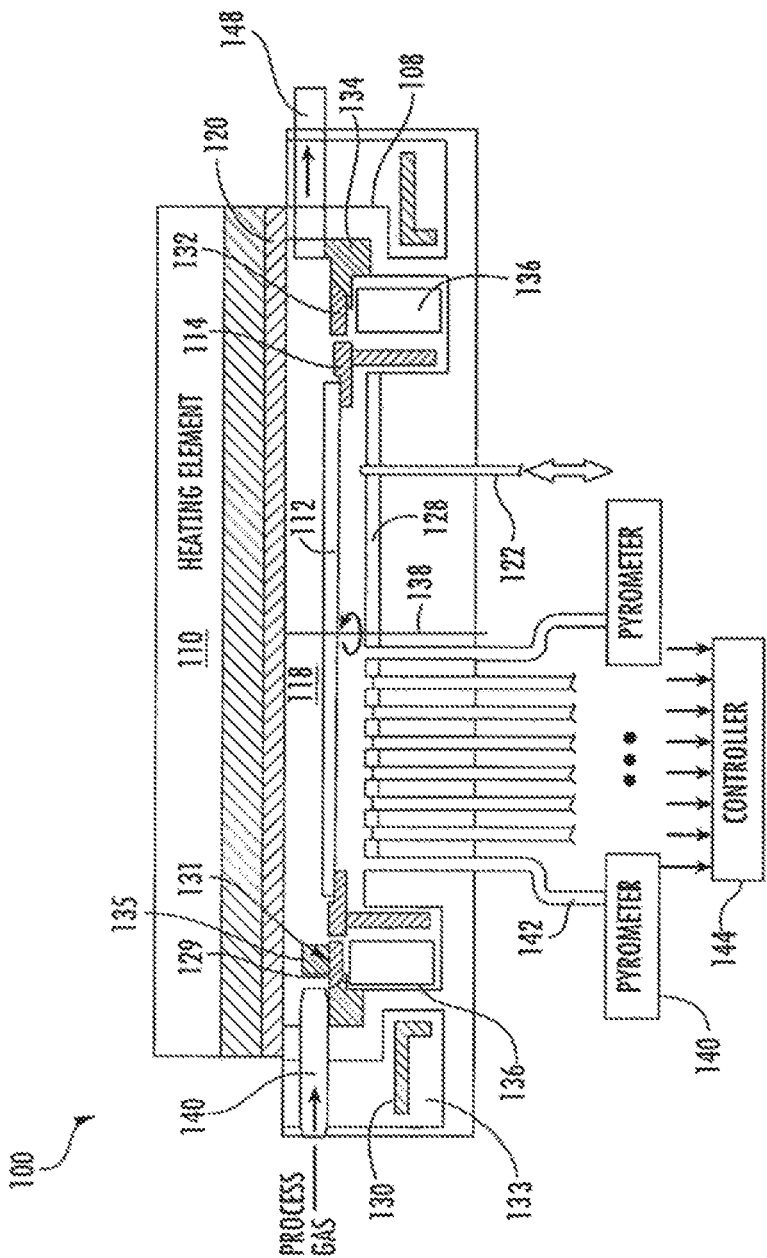
FIG. 1 shows a cross sectional view of a process chamber according to one implementation.

FIG. 1 is a cross sectional view of a process chamber 100 according to an implementation described herein. In one implementation, the process chamber 100 is a rapid thermal process chamber. In this implementation, the process chamber 100 is configured to quickly heat the substrate to change composition and/or microstructure of the substrate. In one example, the process chamber 100 may be a lamp based rapid thermal process chamber. Examples of suitable process chambers include the VULCAN™, RADOX™, and RADIANCE® tools available from Applied Materials, Inc., Santa Clara, Calif. It is contemplated that suitably configured apparatus from other manufacturers may also benefit from the implementations described herein.

The process chamber 100 includes a substrate support 114 disposed in a process area 118 internal to the process chamber 100. A substrate 112 to be processed in the chamber 100 is provided through a valve or access port provided in a side wall of the chamber (not shown) into the processing area 118 of the chamber 100, and is disposed on the substrate support 114. The substrate support 114 in the embodiment of FIG. 1 is an annular member having a shelf formed along an inner radius thereof that supports an edge of the substrate 112, and may contact the outer corner of the edge of the substrate 112. The shelf may have a flat, curved, or sloping surface for supporting the substrate. Three lift pins 122 may be raised and lowered to support the back side of the substrate 112 when the substrate 112 is handled to and from a substrate transfer apparatus, such as a robot blade (not shown) which provides the substrate 112 into the chamber 100, and the substrate support 114. The process area 118 is defined on its upper side by a radiation transmissive window 120 and on its lower side by a substrate plane defined by the shelf of the substrate support 114.

In order to heat the substrate 112, a radiant heating element 110 is positioned above the window 120 to direct radiant energy toward the substrate 112. In the chamber 100, the radiant heating element 110 may include a plurality of high-intensity tungsten-halogen lamps positioned in respective reflective tubes arranged in a hexagonal close-packed array above the window 120. As provided herein, rapid thermal processing (RTP) refers to an apparatus capable of uniformly heating a substrate at rates of about 50° C./sec and higher, for example at rates of about 100° C. to about 150° C./sec, and about 200° to about 400° C./sec. Typical ramp-down (cooling) rates in RTP chamber are in the range of about 80° C. to about 150° C./sec. Some processes performed in RTP chambers require variations in temperature across the substrate of less than a few degrees Celsius. Thus, an RTP chamber may include a lamp or other suitable heating system and heating system control capable of heating at a rate of up to about 100° C. to about 150° C./sec, and about 200° to about 400° C./sec.

Many types of lamps may be used to provide radiant heat energy to the chamber 100. Generally, the lamps may use resistive heating or radiant gas discharge to quickly elevate the energy output of the radiant source. Examples of suitable lamps include incandescent and tungsten halogen incandescent lamps having an envelope of glass or silica surrounding a filament and flash lamps which comprise an envelope of glass or silica surrounding a gas, such as xenon and arc lamps that may comprise an envelope of glass, ceramic, or silica that may surround a gas or vapor. Such lamps generally provide radiant heat when the gas is energized. As provided herein, the term lamp is intended to include lamps having an envelope that surrounds a radiation source. The "radiation source" of a lamp emits radiation that can thermally couple to the material of a substrate, increasing its temperature. The radiation source is typically a filament that discharges thermal radiation when resistively heated, or a gas that discharges radiant energy on electrical excitation.

The process chamber 100 may include a reflector 128 extending parallel to and facing the substrate 112. The reflector 128 reflects heat radiation emitted from the substrate 112 or transmitted through the substrate 112 back to the substrate 112 to closely control a uniform temperature across the substrate 112. The reflector 128 may have one or more apertures formed therein for accommodating temperature sensors. Pyrometers 146 may be coupled to optical light pipes 142 disposed through the reflector 128, one in each aperture of the reflector 128 to receive thermal radiation from the substrate 112 and register the temperature of the substrate 112. The temperature sensors enable dynamic temperature control of the substrate 112 in radial zones substantially defined by the positions of the temperature sensors. Measurement of temperature in radial zones, coupled with differential control of power to the heating element 110 in matched zones, enables radially uniform thermal processing of the substrate 112. The light pipes 142 may be formed of various structures including sapphire, metal, and silica fiber. A controller 144 receives the outputs of the pyrometers 146 and accordingly controls the power supplied to the heating element 110 to control the radiant heating intensity of the zones during processing.

The process chamber 100 includes a rotor 136. The rotor 136 allows the substrate 112 to be rotated about its center 138 by magnetically coupling the rotor 136 to a magnetic actuator 130 positioned in an actuator cavity 133 at a periphery of the process chamber 100. The rotor 136 comprises a magnetically permeable material such as an iron-containing material. A heating member 132 is removably disposed on a ring support 134 that is coupled to a chamber body 108. The heating member 132 is disposed over the rotor 136 to protect the rotor 136 from the extreme processing environment generated in the processing region 118. In one implementation, the ring support 134 is a lower liner and is made of quartz. The heating member 132 may circumscribe the substrate support 114 while the substrate support 114 is in a processing position. The heating member 132 is formed from a high emissivity material, such as black quartz (which is quartz impregnated with silicon particles), or silicon carbide coated graphite. The heating member 132 includes a segment 129 that, in the embodiment of FIG. 1, is disposed adjacent to a process gas inlet 140. It should be noted that in other implementations, the process chamber may have a larger vertical dimension, and the process gas inlet may not be adjacent to the rotor cover. The segment 129 has a top surface 131 that includes features that increase the surface area of the top surface 131.

In the implementation of FIG. 1, where the segment 129 is adjacent to the process gas inlet 140, process gases flow across the top surface 131 and thermally interact with the top surface 131 and the segment 129. With increased surface area of the top surface 131, thermal interaction with the process gases is increased, and the process gases are heated and activated by the thermal interaction. Thus, the process gases are reactive upon arriving at the edge of the substrate 112. The features may include a plurality of protrusions. In one implementation, the features are a plurality of linear fins 135 disposed on the top surface 131 of the segment 129 of the heating member 132. In one implementation, the heating member 132 is an annular rotor cover. In one implementation, the plurality of linear fins 135 occupy a segment 129 that is between one fourth and one third the heating member 132. The heating member 132 is described in more detail below.

The heating element 110 may provide thermal energy to the heating member 132. The heated heating member 132 enhances deposition uniformity by increasing the temperature of the process gases before the process gases reach the substrate 112. Specifically, the heated heating member 132 activates the process gases, and in some cases thermally decomposes at least part of the process gases, as the process gases flow into the process chamber 100 through the process gas inlet 140. The activated process gases flow across the substrate support 114 and over a top surface of the substrate 112. The activated process gases react with the top surface of the substrate 112 to add material, for example in one or more layers, to the top surface of the substrate 112. The process gases exit the process chamber 100 through a process gas outlet 148. Thus, the process gases flow in a direction generally parallel to the upper surface of the substrate 112.

Figure 2A:
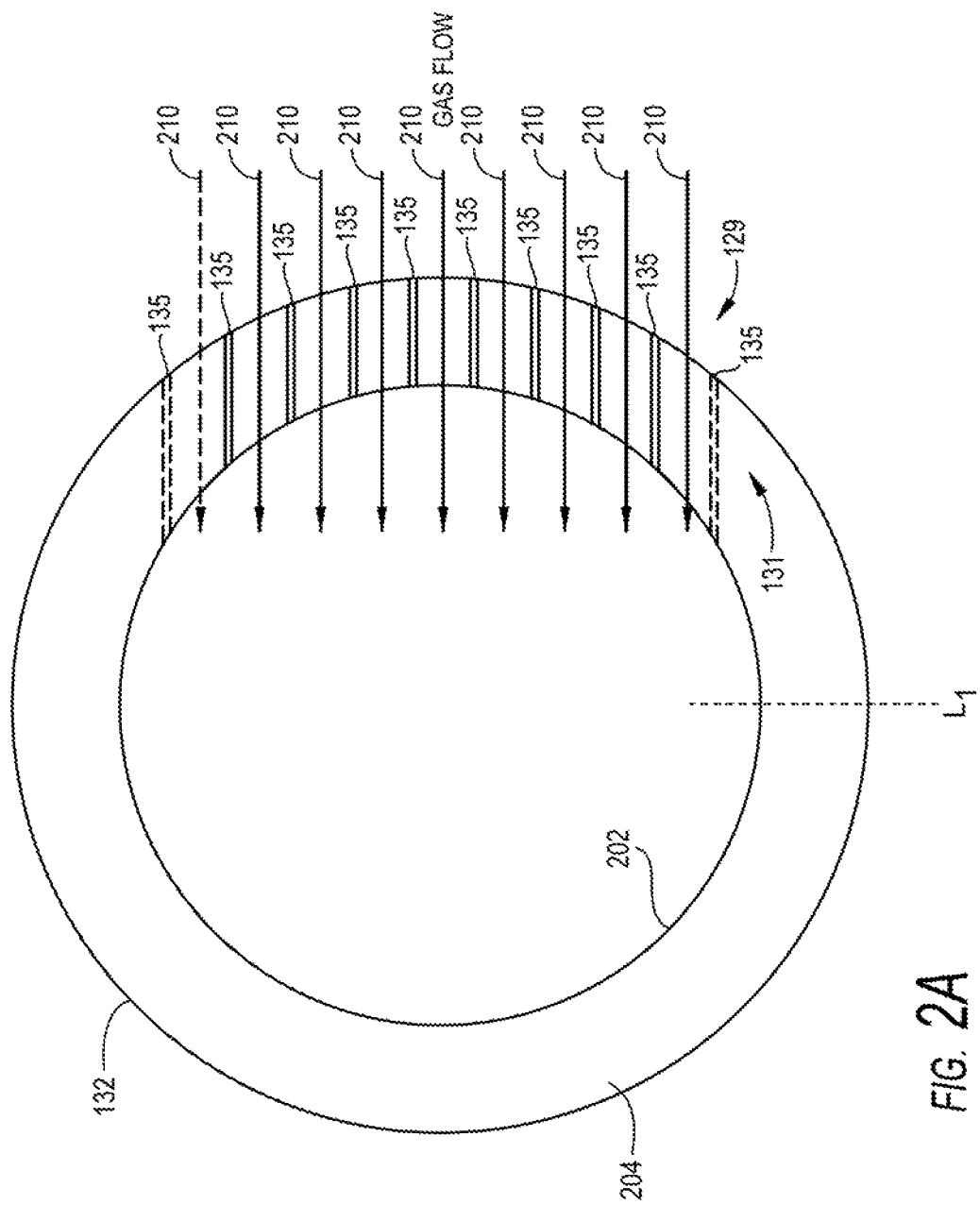
FIG. 2A shows a top view of the heating member according to one implementation described herein.

FIG. 2A shows a top view of the heating member 132 according to one implementation described herein. Process gas flow across the heating member 132 is shown in FIG. 2A. In one implementation, the heating member 132 includes a cut or gap at "L1" to alleviate thermal expansion issues that may occur during processing. The heating member 132 includes a plurality of linear fins 135 occupying a first segment that is between one fourth and one third of the heating member 132. The cut or gap L1 is located on a second segment that is adjacent the first segment. In other words, the cut or gap L1 may be at any location adjacent to the plurality of linear fins 135. In one implementation, when the rotor cover is positioned in the process chamber 100, the cut or gap L1 is perpendicular to the gas path 210. In the embodiment of FIG. 2A, the cut or gap L1 is located at an azimuth of 90° from a centerline of the gas flow paths 210.

The heating member 132 is an annulus, or a substantially annular body in the case of a rotor cover with a gap, that is typically positioned in the process chamber 100 (FIG. 1) over the rotor 136 with an inner wall 202 facing the substrate support 114 and an outer wall 204 that impinges, or comes very near, the ring support 134. In one implementation, the heating member 132 is a concave or convex annulus, or has a concave or convex profile. For example, the top surface 131 may be concave or convex. In some implementations, the heating member 132 has the top surface 131 positioned at an angle such that the height of the outer wall 204 is greater than the height of the inner wall 202 (not shown). In some cases, the rotor cover is shaped such that, when installed in the process chamber 100, the top of the outer wall 204 is on the same plane or aligned with the gas inlet 140 while the top of the inner wall 202 is below the gas inlet 140. In another implementation, when installed in the process chamber 100 and a substrate 112 is disposed on the substrate support 114, the top of the inner wall 202 is below the substrate 112. In one implementation, all the edges of the rotor cover are curved or rounded so that the rotor cover has no sharp edges. In one implementation the edge at the top of the outer wall 204 of the heating member 132 may be curved.

In another implementation, the heating member 132 is a shelf extending from the inner wall 202 of the process chamber 100. The shelf is proximate the gas inlet 140 extending towards the substrate support 114. In this embodiment, the substrate support may be a rotatable pedestal-style substrate support, rather than a magnetically coupled substrate support. The shelf has a plurality of fins, as described elsewhere herein. The fins are similarly oriented and angled to the linear fins 135 described above with respect to other embodiments of the heating member 132. In one embodiment, the shelf is a continuous extension of the inner wall 202 extending circumferentially around the entire chamber. In another embodiment, the shelf extends from the inner wall 202 proximate the gas inlet 140 and only along a portion of the circumference of the chamber.

In the embodiment of FIG. 2A, the plurality of linear fins 135 disposed on the heating member 132 occupy a segment that is one third of the heating member 132. Each of the linear fins 135 is parallel to one another. As shown in FIG. 2A, each fin extends from the inner wall 202 to the outer wall 204 and is spaced apart equal distance from one another. In another embodiment, the spacing of the plurality of linear fins 135 may be different. In yet another embodiment, the fins may extend only partway from the outer wall 204 to the inner wall 202, or partway from the inner wall 202 to the outer wall 204. FIG. 2A shows eight fins, it is contemplated that the plurality of linear fins 135 can include more than eight fins or less than eight fins. Each of the linear fins 135 may be parallel to the direction of gas flow from the gas inlet 140, when the heating member 132 is installed within the chamber 100. For example, the plurality of linear fins 135 may be located in a segment of the heating member 132 that spans the opening of the gas inlet 140 within the chamber 100. In the embodiment of FIG. 2A, the cut or gap L1 is located at an azimuth of 90° from a center of the segment of the heating member 132 occupied by the linear fins 135.

In one implementation, the plurality of linear fins 135 are disposed on the top surface 131 of the heating member 132, for example as an insert installed on the top surface 131. In yet another implementation, the heating member 132 and the plurality of linear fins 135 are molded as one piece. In yet another implementation, the plurality of linear fins 135 are disposed within a plurality of recesses 137, as shown in FIG. 2B.

Process gases may flow through the gas paths 210 formed by the plurality of linear fins 135, when the heating member 132 is within the chamber 100. In one implementation, the plurality of linear fins 135 may be disposed in an arrangement such that the gas paths 210 are radial. In another implementation, the plurality of linear fins 135 may be disposed in an arrangement such that the gas paths 210 are parallel to each other. The plurality of linear fins 135 provides a greater surface area in contact with the gas as the gas flows across the top surface 131. With an increased surface area, preheating of the process gases is improved, leading to improved process gas activation.

The plurality of linear fins 135 comprises a material capable of withstanding the processing conditions of the thermal chamber without undergoing chemical change such as oxidation. As such, the material of the plurality of linear fins 135 eliminates the conditioning trend or drift time associated with the chemical changes that leads to nonuniform processing among successive substrates. In other words, the plurality of linear fins 135 maintains substantially the same properties after processing an arbitrary number of substrate, which advantageously provides for a more uniform substrate processing. The plurality of linear fins 135 may thus comprise an opaque quartz such as a silicon black quartz. The silicon black quartz may be made by growing and combining silicon into molten quartz, molding or casting the material, and then post-machining the cold ingot into the desired shape. In one embodiment, the opaque quartz has an optical density of greater than 3. In another embodiment, the annular body made be a material with an optical density greater than 3.

Figure 2B:
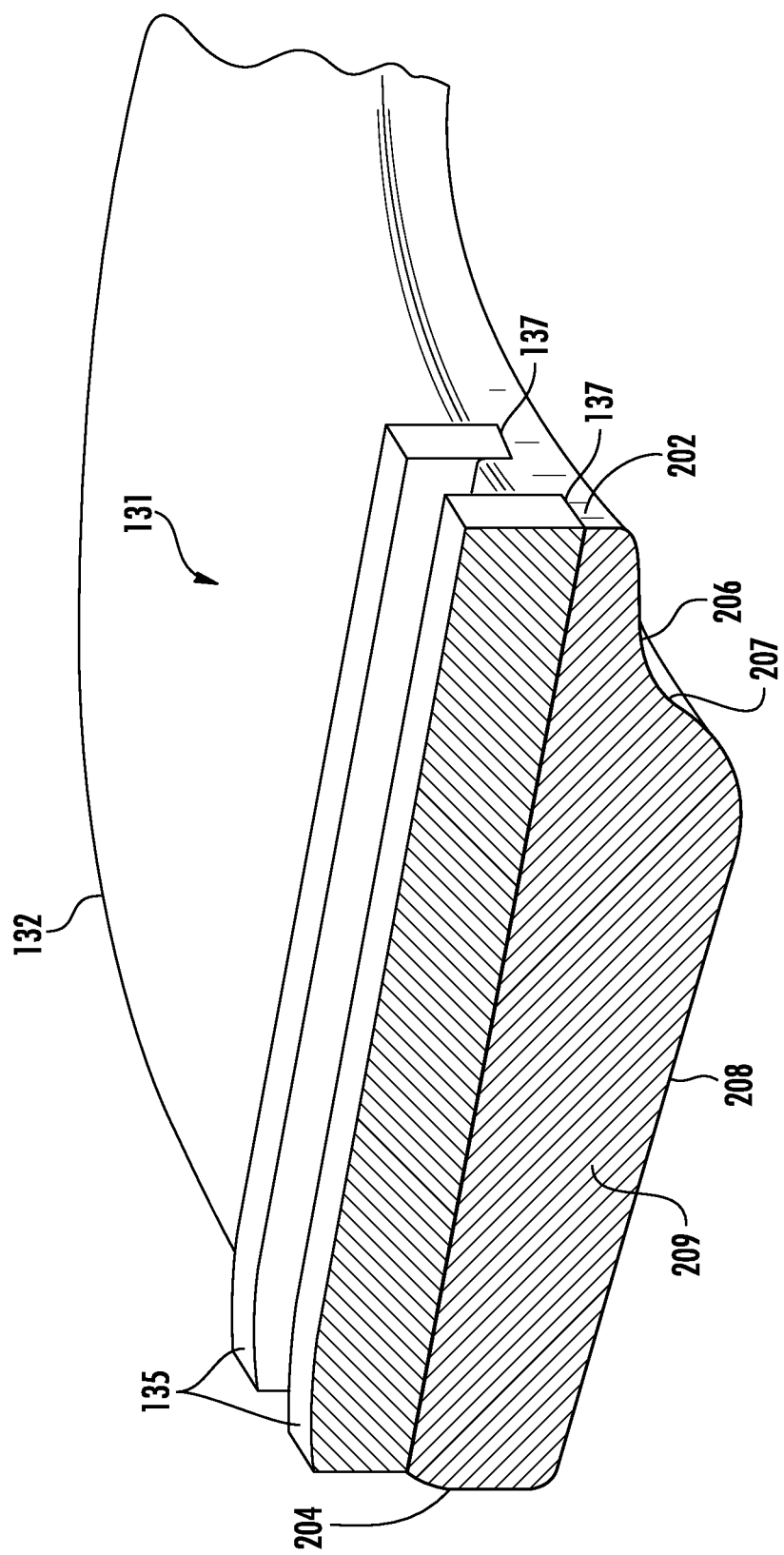
FIG. 2B shows a perspective view of a rotor cover according to one implementation described herein.

FIG. 2B shows a perspective view of the heating member 132 according to one embodiment. The heating member 132 may include an inner lip 206, a body 209, a plurality of recesses 137, and a plurality of linear fins 135. The inner lip 206 projects radially outward from the body 209 of the heating member 132. The inner lip 206 may be adjacent to the substrate support 114 when the heating member 132 is installed in the process chamber 100. The inner lip 206 is a feature formed in a bottom surface 208 of a body 209 of the heating member 132. The inner lip 206 forms a recess extending from the inner wall 202 outward toward the outer wall 204, and ending in a curved portion 207 that connects the inner lip 206 to the bottom surface 208. A thickness of the inner lip 206 may be less than a thickness of the body 209. The inner lip 206 may allow air flow and cooling below the heating member 132 adjacent to the rotor 136 when the heating member 132 is installed in the process chamber 100.

In one case, the top surface 131 extends radially outward further than the bottom surface 208. In the embodiment of FIG. 2B, the top surface 131 extends from the outer wall 204 to the inner wall 202, while the bottom surface 208 of the body 209 is connected to the inner wall 202 by the curved portion 207 and the inner lip 206. In one implementation, the bottom surface 208 is opposite the top surface 131. When the heating member 132 is within the chamber 100, the bottom surface 208 may be in contact with the ring support 134.

The inner wall 202 may be a vertical inner wall, as shown in FIG. 2B. In other implementations, the inner wall 202 may be a slanted or curved inner wall, which may incline toward the top surface 131 or toward the bottom surface 208. Thus, in some cases, the inner wall 202 is connected to the top surface 131 by an angled surface that slopes upward from the inner wall 202 to the top surface 131. In other cases, the inner wall 202 is connected to the bottom surface 208 by an angled surface that slopes downward from the inner wall 202 to the bottom surface 208.

As shown in the implementation of FIG. 2B, the plurality of linear fins 135 are disposed in the plurality of recesses 137. The plurality of recesses 137 are disposed in the body 209 and the inner lip 206 of the heating member 132 along the top surface thereof. The plurality of recesses 137 may extend from the inner wall 202 to the outer wall 204 of the heating member 132. The plurality of recesses 137 may extend into the inner lip 206. The plurality of recesses 137 may occupy a segment that is one third the heating member 132. Within the one third segment, the plurality of recesses 137 are disposed equidistant each other. In another implementation, the spacing between each recess of the plurality of recesses may be different or varied from one recess to the next. In the implementation of FIG. 2B, the plurality of recesses 137 provide support for the plurality of linear fins 135. In other words, the plurality of linear fins 135 are affixed to the heating member 132 by the plurality of recesses 137.

Advantageously, the opaque quartz provides for a lower recombination coefficient than other materials as reactants move across the heating member 132 towards the substrate 112. When using conventional rotor covers, as reactants move across the rotor cover, an amount of reactant will be lost to the interaction with the material of the rotor cover. However, the opaque quartz heating member 132 advantageously resists interaction with the process gases, aids in energy absorption, and provides for a larger amount of reactants to reach the substrate 112. During processing using conventional rotor covers, particle contamination can occur due to the interaction of the rotor cover with the ring support 134 as the rotor cover expands and contracts while heating in cooling during processing. The black quartz material of the heating member 132 advantageously has a low coefficient of thermal expansion (CTE) reducing interaction with the ring support 134 and ultimately reducing the particle contamination on the substrate 112.

FIG. 3 shows a top view of the rotor cover 332 according to another implementation described herein. The rotor cover 332 may have a profile substantially similar to the heating member 132, as seen in FIG. 2B. The rotor cover 332 includes an inner wall 302, an outer wall 304, and a plurality of fins 335 disposed on the rotor cover 332. The rotor cover 332 includes a segment 329. The segment 329 may be disposed adjacent to a process gas inlet 140 when the rotor cover 332 is within the chamber 100. The segment 329 has a top surface 331 and occupies about one third the rotor cover 332. The top surface 331 is angled downward with the outer wall 304 of the rotor cover 332 having a greater height than the inner wall 302 of the rotor cover 332. The top surface 331 includes the plurality of fins 335. The plurality of fins 335 occupy a segment that is between one fourth and one third the rotor cover 332. Each of the fins 335 are disposed parallel to each other. The plurality of linear fins 335 extend at an angle from the inner wall 302 to the outer wall 304. In one implementation the height of the plurality of fins 335 at a location adjacent to the inner wall 302 is lower than the height of the plurality of fins 335 at a location adjacent to the outer wall 304. In some implementations, each of the plurality of fins 335 has an angled top surface such that the height near the outer wall 304 is greater than the height near the inner wall 302. In another implementation, the plurality of fins 335 have a planar top surface such that the fin height near the outer wall 304 is substantially the same as the fin height of the inner wall 302. In other words, even though the rotor cover 332 has an angled top surface 331, the plurality of fins 335 have a top surface near the inner wall 302 that is the same height as a top surface near the outer wall 304.

Within chamber 100, the plurality of fins 335 are arranged at an angle from the gas path 310 such that the gas path flows between the plurality of fins 335. The plurality of fins 335 increase the thermal conduction of the top surface 331. With an increased surface area, the preheating of the process gases is improved, leading to improved process gas activation. Additionally, the angled plurality of fins 335 help reduce gas flow turbulence when the rotor cover 332 is within the chamber 100. The angled plurality of fins 335 directs the process gas 310 to enter the processing region 118 at an angle during processing.

Figure 4:
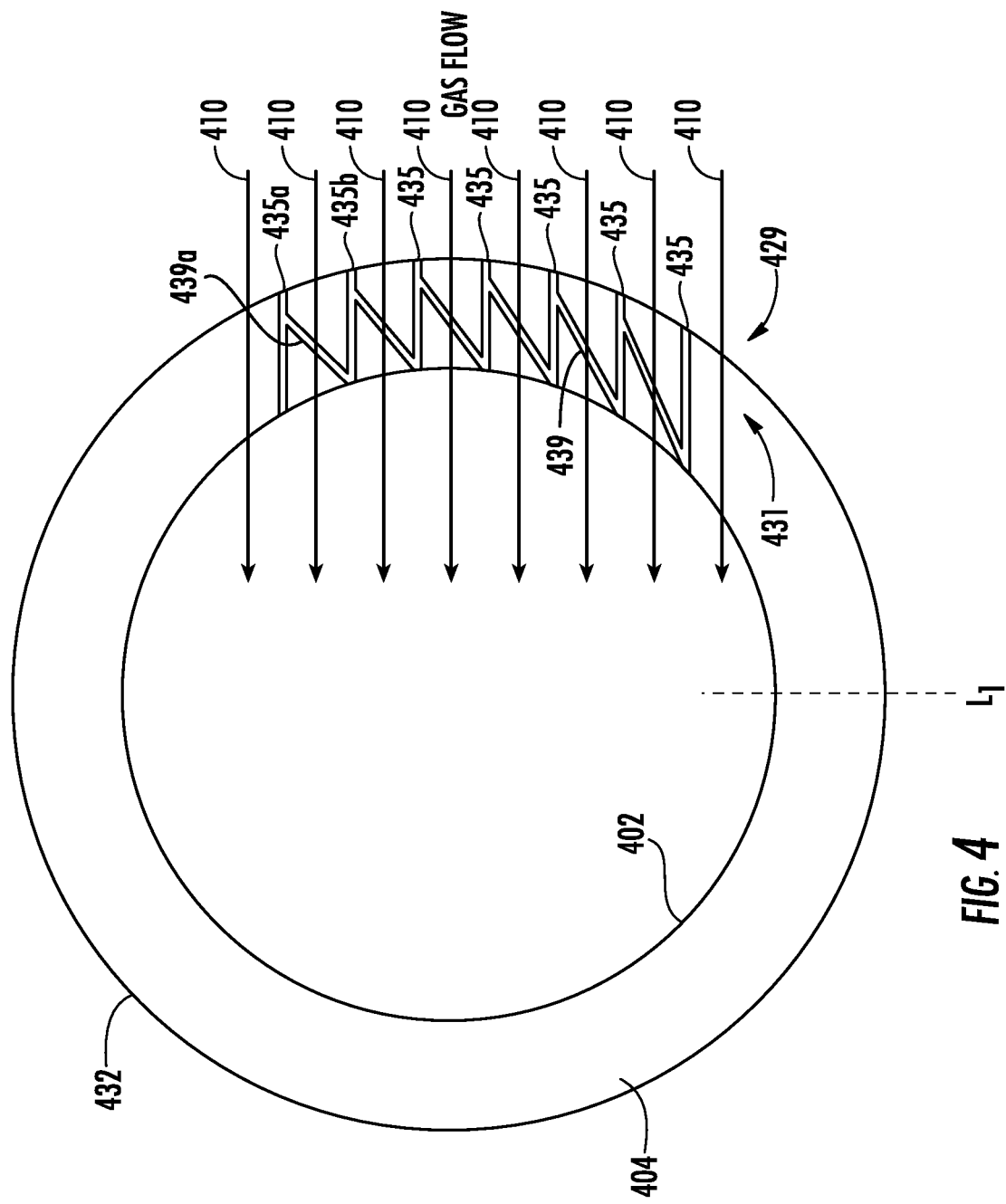
FIG. 4 shows a top view of the rotor cover according to another implementation described herein.

FIG. 4 shows a top view of the rotor cover 432 according to another implementation described herein. The rotor cover 432 is substantially similar to the heating member 132, as seen in FIG. 1. The rotor cover 432 includes an inner wall 402, an outer wall 404, and a plurality of fins 435 disposed on the rotor cover 432. The rotor cover 432 includes a segment 429 that occupies between one fourth and one third the rotor cover 432. The segment 429 has a top surface 431 and process gases flow across the top surface 431 from the process gas inlet 140 during operation. The top surface 331 may include the plurality of fins 435. In one implementation, the plurality of fins 435 are disposed on the top surface 431 of the segment 429 adjacent the process gas inlet 140 when the rotor cover 432 is within the chamber 100. Within the chamber 100, the plurality of fins 435 are arranged parallel the gas path 410.

The plurality of fins 435 comprises a material capable of withstanding the processing conditions of the thermal chamber without undergoing chemical change such as oxidation. The plurality of fins 435 may thus comprise an opaque quartz such as a silicon black quartz. Each of the linear fins 435 are disposed parallel to each other. The plurality of fins 435 extend in a straight line from the inner wall 402 to the outer wall 404. It is contemplated, however, that the plurality of fins 435 may occupy an area between the inner wall 402 and the outer wall 404. In other words, the plurality of fins 435 do not extend the entire length between the inner wall 402 and the outer wall 404. In one implementation the plurality of fins 435 include projections 439. The projections 439 may be disposed between, extend to, and connect one fin to an adjacent fin of the plurality of fins 435. For example, the projection 439a is disposed between fin 435a and 435b. The projection 439a connects fin 435a and fin 435b. The projections 439 may be disposed parallel to each other. In one implementation, the projections 439 may extend from the top surface of one fin to the top surface of an adjacent fin. In another implementation, the projections 439 make up a lattice work with the plurality of fins 435. The projections 439 may extend from the bottom of one fin to the top of an adjacent fin. The projections 439 advantageously increase the surface area of the plurality of fins 435. With an increased surface area, the preheating of the process gases is improved, leading to improved process gas activation.

Figure 5:
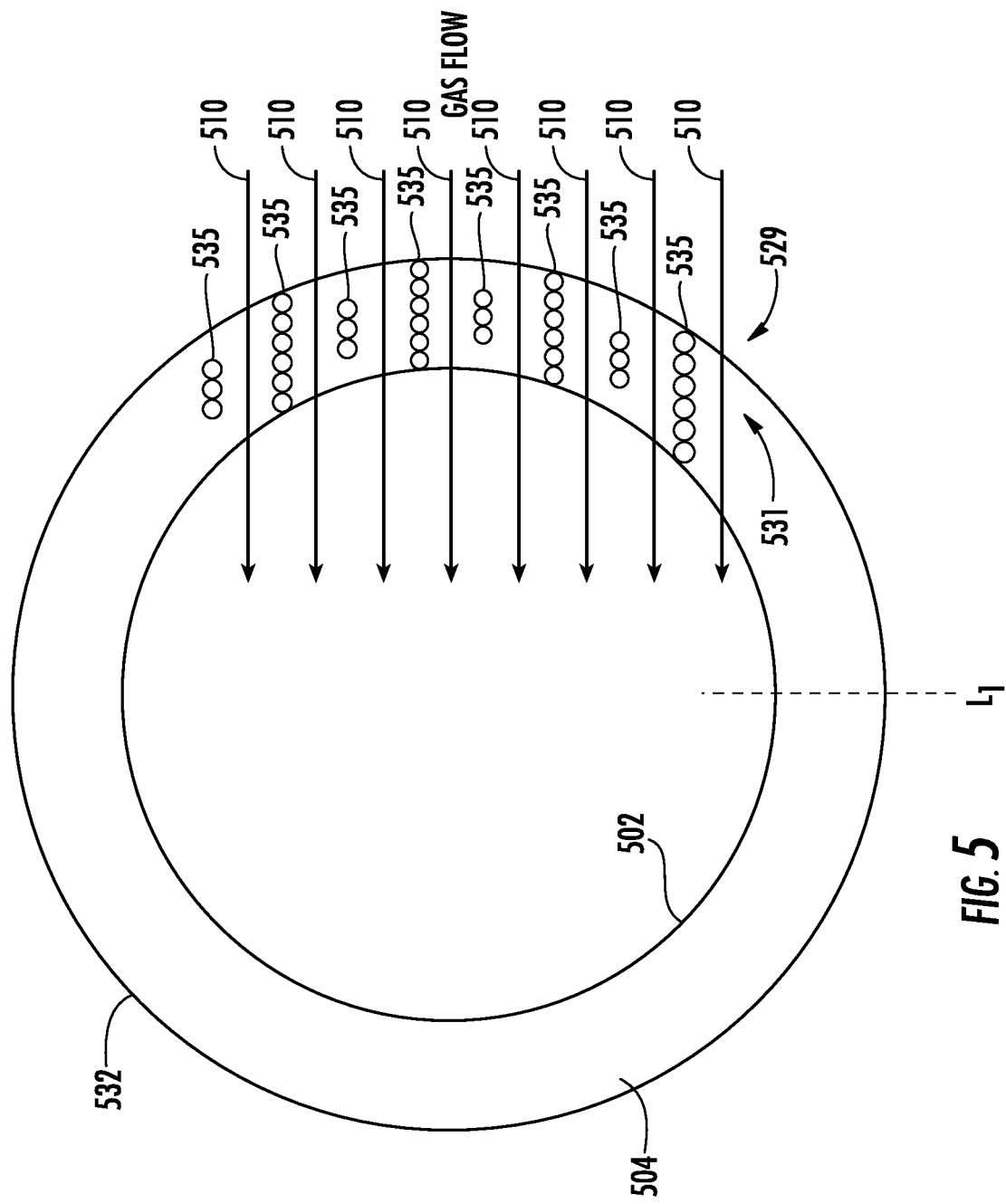
FIG. 5 shows a top view of the rotor cover according to another implementation described herein.

FIG. 5 shows a top view of a rotor cover 532 according to another implementation described herein. The rotor cover 532 may have a profile substantially similar to the heating member 132, as seen in FIG. 2B, and can be used as a heating member in the chamber 100. The rotor cover 532 includes an inner wall 502, an outer wall 504, and a plurality of protrusions 535 disposed on the rotor cover 532. The rotor cover 532 includes a segment 529. The segment 329 has a top surface 531 and occupies between one fourth and one third the rotor cover 532.

The top surface 531 includes the plurality of protrusions 535. The plurality of protrusions 535 occupy a segment that is between one fourth and one third the rotor cover 532. Each of the protrusions 535 are disposed parallel to each other. The plurality of protrusions 535 may be circular, square, hexagonal, elliptical, tear drop, or other shape or combination thereof. The plurality of protrusions 535 may be disposed in a linear arrangement, as seen in FIG. 5, or dispersed non-linearly within segment 529. In other words, the plurality of protrusions 535 may be arranged randomly within segment 529. The plurality of protrusions 535 may be columns or small bumps on the top surface 531 of the rotor cover 532. The plurality of protrusions 535 may be affixed to the rotor cover 532 by a plurality of recesses. The plurality of protrusions 535 may extend from the inner wall 502 to the outer wall 504 or may be within an area between the inner wall 502 and the outer wall 504.

Within the chamber 100, the plurality of protrusions 535 are arranged near the gas flow path 510 such that the gas flow 510 may flow in between the plurality of protrusions 535. In the implementation where the plurality of protrusions 535 are a small bump on the surface 531 of the rotor cover 532, the gas flow 510 may flow over the plurality of protrusions 535. The plurality of protrusions 535 increases the thermal conduction of the top surface 331. With an increased surface area, the preheating of the process gases is improved, leading to improved process gas activation.

In summary, a processing apparatus having a rotor cover with a plurality of fins is disclosed. The plurality of fins may provide for better heating of the process gases. The rotor cover may provide for more consistent processing as the material of the rotor cover and the plurality of fins substantially eliminates the conditioning trend associated with chemical processes such as oxidation. The material of the preheat has a low recombination coefficient such that more of the process gases reaches the substrate, thus providing for more efficient and uniform processing. The interaction between the process gases and the rotor cover is substantially reduced preserving laminar flow as the gas flows towards the substrate. Furthermore, the rotor cover material has a low CTE reducing particle contamination due to excessive expansion during processing.

While the foregoing is directed to embodiments, other and further embodiments may be devised without departing from the basic scope thereof, and the scope thereof is determined by the claims that follow.

The invention claimed is:

1. A rotor cover piece for a thermal treatment chamber, comprising:
an annulus having:
an inner wall with a first height;
an outer wall with a second height greater than the first height;
a bottom surface; and
a top surface connecting a top of the inner wall with a top of the outer wall;
wherein edges of the inner wall and outer wall are rounded so that the rotor cover piece has no sharp edges;
an inner lip extending from the inner wall, wherein the inner lip forms a recess extending from the inner wall outward toward the outer wall and ending in a curved portion that connects the inner lip to the bottom surface; and
a plurality of fins comprising silicon black quartz and extending from the top surface of the annulus, wherein the plurality of fins is formed along a segment of the rotor cover piece which occupies one fourth to one third of the area of the top surface, and wherein the height of the plurality of fins at a location adjacent to the inner wall is lower than the height of the plurality of fins at a location adjacent to the outer wall.

2. The rotor cover piece of claim 1, wherein the plurality of fins has lattice-type structures.

3. The rotor cover piece of claim 1, wherein each of the plurality of fins extends from the top of the inner wall to the top of the outer wall.

4. The rotor cover piece of claim 1, wherein the plurality of fins is formed along a segment of the rotor cover piece which occupies one third of an area of the rotor cover piece.

5. The rotor cover piece of claim 1, wherein the fins are linear fins that are parallel to each other.

6. The rotor cover piece of claim 1, wherein the rotor cover piece further includes a plurality of recesses, and wherein each fin of the plurality of fins is disposed in a respective recess of the plurality of recesses.

7. The rotor cover piece of claim 1, wherein each of the fins is circular, square, hexagonal, elliptical, tear drop shape, or combination thereof.

8. The rotor cover piece of claim 7, wherein the rotor cover piece further includes a plurality of recesses, and wherein each fin of the plurality of fins is disposed in a respective recess of the plurality of recesses.

9. A rotor cover piece for a thermal treatment chamber, comprising:
an annulus comprising:
an inner wall;
an outer wall;
a bottom surface; and
a top surface connecting a top of the inner wall with a top of the outer wall wall;
wherein edges of the inner wall and outer wall are rounded so that the rotor cover piece has no sharp edges;
an inner lip extending from the inner wall, wherein the inner lip forms a recess extending from the inner wall outward toward the outer wall and ending in a curved portion that connects the inner lip to the bottom surface;
a plurality of fins disposed on the top surface of the annulus, wherein the plurality of fins comprises silicon black quartz, wherein the plurality of fins is formed along a segment of the rotor cover piece which occupies one fourth to one third of the area of the top surface, and wherein the height of the plurality of fins at a location adjacent to the inner wall is lower than the height of the plurality of fins at a location adjacent to the outer wall; and
a plurality of recesses, wherein each fin of the plurality of fins is disposed in a respective recess of the plurality of recesses.

10. The rotor cover piece of claim 9, wherein the plurality of fins comprises a plurality of projections and wherein the plurality of projections extends in between the plurality of fins.

11. The rotor cover piece of claim 10, wherein each projection of the plurality of projections is disposed on and extends between top surfaces of the plurality of fins.

12. The rotor cover piece of claim 9, wherein the fins are formed along a segment of the rotor cover piece that is one third of the rotor cover piece.

13. The rotor cover piece of claim 9, wherein each of the plurality of fins extends from the top of the inner wall to the top of the outer wall.

14. The rotor cover piece of claim 9, wherein the annulus comprises silicon black quartz.

15. A rotor cover piece for a thermal treatment chamber, comprising:
an annulus having:
an inner wall;
an outer wall;
a bottom surface; and
a top surface connecting a top of the inner wall with a top of the outer wall;
wherein edges of the inner wall and outer wall are rounded so that the rotor cover piece has no sharp edges;
an inner lip extending from the inner wall, wherein the inner lip forms a recess extending from the inner wall outward toward the outer wall and ending in a curved portion that connects the inner lip to the bottom surface; and
a plurality of fins comprising silicon black quartz and disposed on the top surface of the annulus, wherein the plurality of fins is formed along a segment of the rotor cover piece which occupies one fourth to one third of the area of the top surface, and wherein the height of the plurality of fins at a location adjacent to the inner wall is lower than the height of the plurality of fins at a location adjacent to the outer wall.

16. The rotor cover piece of claim 15, wherein the plurality of fins is pointed radially inward towards the center of the annulus.

\* \* \* \* \*